United States Patent
Barr et al.

(10) Patent No.: US 7,348,498 B2
(45) Date of Patent: *Mar. 25, 2008

(54) PARTIALLY VOIDED ANTI-PADS

(75) Inventors: Andew Harvey Barr, Roseville, CA (US); Dale John Shidla, Roseville, CA (US); Robert William Dobbs, Granite Bay, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 542 days.

This patent is subject to a terminal disclaimer.

(21) Appl. No.: 10/621,661

(22) Filed: Jul. 17, 2003

(65) Prior Publication Data

US 2005/0011675 A1    Jan. 20, 2005

(51) Int. Cl.
*H05K 3/10* (2006.01)
*H05K 3/02* (2006.01)
*H05K 1/11* (2006.01)
*H01R 12/04* (2006.01)

(52) U.S. Cl. ............ 174/262; 174/255; 361/792; 29/846; 29/847

(58) Field of Classification Search ........ 174/261–266, 174/255; 361/792–795; 29/846–847
See application file for complete search history.

(56) References Cited

U.S. PATENT DOCUMENTS

| 5,315,069 | A | * | 5/1994 | Gebara | 174/250 |
| 5,828,555 | A | * | 10/1998 | Itoh | 361/784 |
| 5,844,146 | A | * | 12/1998 | Murray et al. | 73/862.043 |
| 6,235,994 | B1 | * | 5/2001 | Chamberlin et al. | 174/252 |
| 6,329,603 | B1 | * | 12/2001 | Japp et al. | 174/255 |
| 6,366,466 | B1 | | 4/2002 | Leddige et al. | |
| 6,501,181 | B2 | * | 12/2002 | Albinsson | 257/774 |
| 6,538,538 | B2 | | 3/2003 | Hreish et al. | |
| 6,555,914 | B1 | | 4/2003 | Thurairajaratnam et al. | |
| 6,710,258 | B2 | * | 3/2004 | Oggioni et al. | 174/255 |
| 6,716,072 | B1 | | 4/2004 | Downes | |
| 7,141,742 | B2 | * | 11/2006 | Barr et al. | 174/262 |
| 2002/0130737 | A1 | | 9/2002 | Hreish et al. | |
| 2004/0188135 | A1 | * | 9/2004 | Brodsky et al. | 174/255 |

FOREIGN PATENT DOCUMENTS

GB    2 374 984    10/2002

OTHER PUBLICATIONS

GB Search Report for Application No. GB0415346.6 mailed on Nov. 12, 2004 (3 pages).

* cited by examiner

*Primary Examiner*—Jeremy C Norris

(57) ABSTRACT

A printed circuit board comprises a conductive layer and a via transecting the conductive layer. The printed circuit board comprises a pattern of conductive material having a plurality of voids in the conductive layer near the via.

35 Claims, 2 Drawing Sheets

PARTIALLY VOIDED ANTI-PADS

BACKGROUND

High speed serial communications implemented on printed circuit boards (PCBs) are becoming increasingly popular for high bandwidth data transfer. PCBs typically are made up of multiple layers or planes including power planes, ground planes, and signal planes. Vias are employed to route traces for transmitting signals from the top layer of a PCB to a lower layer of a PCB, or to route traces from one layer to another layer within the PCB. Vias are conductors that connect traces from one layer in a PCB to traces in another layer in a PCB. When vias pass through a power or ground plane, the conducting material around the via on the power or ground plane is removed to prevent a short between the via and the power or ground plane. The area that is removed creates a void called an anti-pad.

A stray or parasitic capacitance is formed between the via barrel and the conductive material of the power or ground plane near the via barrel. This stray capacitance is inversely proportional to the size and surface area of the anti-pad. In other words, as the size and surface area of the anti-pad increases, the stray capacitance decreases, and as the size and surface area of the anti-pad decreases, the stray capacitance increases. For low speed signals, such as signals less than approximately 2 GHz, the stray capacitance typically does not have an appreciable effect on signal integrity. As signal speeds increase to greater than approximately 2 GHz, however, the stray capacitance has an increasingly more significant effect on signal integrity. Therefore, it is desirable to reduce the stray capacitance when transmitting high speed signals through vias on PCBs.

Various approaches have been proposed to reduce the stray capacitance. One approach is to increase the size of the anti-pad. This approach, however, can result in non-planarity issues of layers or planes within PCBs. Non-planarity typically occurs during the manufacturing of a PCB when dielectric material settles into the voided area of the anti-pad. The settled dielectric material causes dips on the board surface around the via, thereby reducing the planarity of the board surface. As the anti-pad size is increased to reduce stray capacitance, the non-planarity of the PCB also increases due to the increased voided anti-pad area in which dielectric material settles.

Increasing the size of the anti-pad may also lead to a choking off of power or ground planes in areas where there are many vias situated close together, such as where an integrated circuit is mounted to a PCB. Power or ground planes can be choked off when too much conductive material is removed from the power or ground planes to form the anti-pads of increased size. The choking off of power or ground planes typically prevents signal traces running between the vias on adjacent signal layers from having a good power or ground reference on the power or ground layer where the anti-pads are formed.

Other approaches reduce the stray capacitance by removing or not fabricating unused portions of the via. The stray capacitance is reduced by decreasing the number of power or ground planes that a via must pass through. One such approach uses blind vias or buried vias, which are vias that do not pass completely through a PCB. The disadvantages of this approach are that blind or buried vias may increase fabrication costs and may not support known soldering techniques, such as pin-in-hole soldering techniques. Another approach utilizes a drill to counter bore and remove unused portions of a via. A disadvantage of this approach is an increase in fabrication costs.

Another approach takes an entirely different avenue to dealing with stray capacitance. Rather than attempting to minimize the stray capacitance, this approach actually increases the capacitance to set values. The set values of capacitance are used in an attempt to optimize the frequency response characteristics of a via or as part of a filter for signals transmitted through the via. The disadvantage of this approach is that different via and anti-pad designs are required based upon the signal that will be transmitted through the via.

High speed signals on a PCB commonly originate within an integrated circuit such as an application specific integrated circuit (ASIC) mounted to the PCB. The integrated circuit may be mounted to the PCB in any number of ways, including using different soldering techniques and sockets that allow the integrated circuit to be removed and remounted on the PCB. To mount integrated circuits to a PCB, the planarity of the PCB must be maintained to a tight tolerance to maintain a high integrity signal between the integrated circuit and the PCB. Non-planarity of the PCB reduces this tight tolerance and therefore the integrity of the signal.

For reasons stated above and for other reasons presented in the present specification, there is a need for a PCB that includes anti-pad designs associated with vias that will minimize capacitance, maximize board planarity, and minimize signal trace routing issues, thereby allowing high speed serial communications regardless of the environment or application.

SUMMARY

One aspect of the present invention provides a printed circuit board. The printed circuit board comprises a conductive layer and a via transecting the conductive layer. The printed circuit board comprises a pattern of conductive material having a plurality of voids in the conductive layer near the via.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Vias in (PCBs) route signals from one layer within a PCB to another layer within the PCB. Anti-pads are employed to create a void between the via and the conductive plane to prevent shorts between the vias and conductive planes through which vias may pass.

Figure 1:
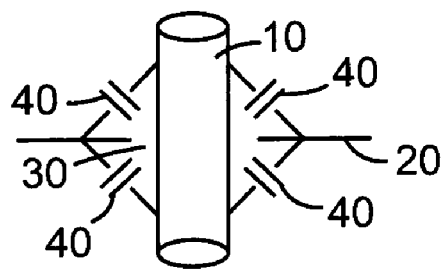
FIG. 1 is a diagram illustrating an exemplary embodiment of a via and stray capacitance associated with the via.

FIG. 1 is a diagram illustrating an exemplary embodiment of a vertical cross section of a printed circuit board (PCB) including via barrel 10, conductive plane 20, anti-pad 30, and a representation of stray capacitance 40. In one embodiment conductive plane 20 is a power, and in another embodiment conductive plane 20 is a ground plane. In one embodiment, conductive plane 20 is fabricated from copper or a copper alloy. In other embodiments, conductive plane 20 is fabricated from any suitable conductive material or from any suitable alloy including conductive material.

As illustrated in FIG. 1, via barrel 10 is perpendicular to and passes through conductive plane 20. Via barrel 10, however, can be oriented at any suitable angle with respect to conductive plane 20. The void between via barrel 10 and conductive plane 20 is anti-pad 30.

Anti-pad 30 is formed by removing the conductive material from conductive plane 20 around via barrel 10 using any suitable process. In one embodiment, the conductive material is removed by using a known etching process. Stray capacitance 40 represents the stray capacitance between via barrel 10 and conductive plane 20. Stray capacitance is undesirable in the transmission of high speed signals, such as signals greater than approximately 2 GHz. Specifically, stray capacitance reduces the integrity of high speed signals transmitted within and through a PCB. Stray capacitance 40 is inversely proportional to the size and surface area of anti-pad 30. As the size and surface area of anti-pad 30 are increased, stray capacitance 40 decreases. Conversely, as the size and surface area of anti-pad 30 are decreased, stray capacitance 40 increases.

Figure 2:
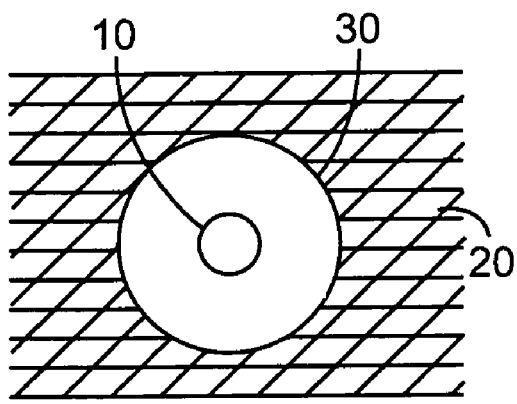
FIG. 2 is a diagram illustrating an exemplary embodiment of a cross section of a via and an associated anti-pad.

FIG. 2 is a diagram illustrating an exemplary embodiment of a cross section of via 10, anti-pad 30, and conductive plane 20. Anti-pad 30 forms a void in conductive plane 20 around via 10. In one embodiment, via 10 and anti-pad 30 are substantially circular in shape. In other embodiments, via 10 and anti-pad 30 may be other shapes, such as square, rectangular, or oblong. Increasing the size of anti-pad 30 can result in non-planarity issues of layers or planes within a PCB. For example, dielectric material may settle into the void in conductive plane 20 and lead to non-planarity of the PCB. As the size of the void is increased, non-planarity of the PCB increases. Conversely, as the size of the void is decreased, non-planarity of the PCB decreases.

Figure 3:
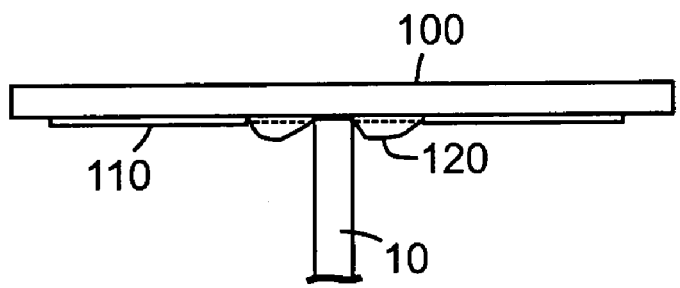
FIG. 3 is a diagram illustrating an exemplary embodiment of non-planarity issues associated with a prior art PCB.

FIG. 3 is a diagram illustrating an exemplary embodiment of an integrated circuit 100 mounted on a surface of a PCB 110. FIG. 3 further illustrates planarity issues associated with anti-pads. Dips 120 around via 10 are formed during manufacturing when dielectric material settles into the voided power or ground plane area of anti-pad 30, shown in FIG. 2. Dips 120 cause PCB 110 to be non-planer. The non-planarity increases as the size of anti-pad 30 increases. The non-planarity increases because the size of the void, which defines anti-pad 30, increases, thereby leaving more voided area in which dielectric material settles into. The non-planarity prevents integrated circuit 100 from being properly mounted to PCB 110. An improper mounting of integrated circuit 100 on PCB 110 decreases the signal integrity between integrated circuit 100 and PCB 110.

Figure 4:
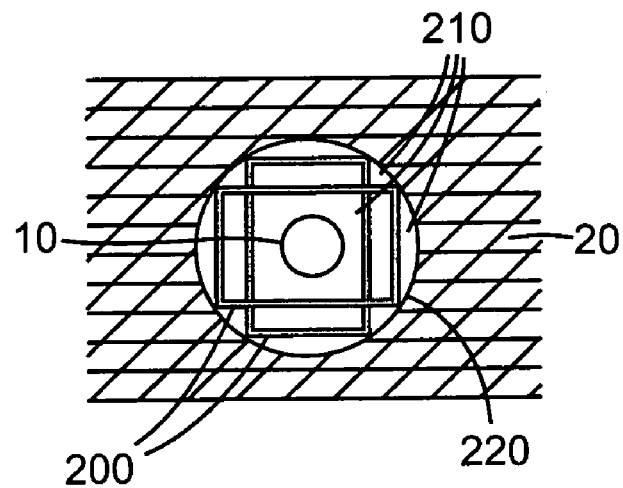
FIG. 4 is a diagram illustrating an exemplary embodiment of a cross section of a via and an associated partially voided anti-pad.

FIG. 4 is a diagram illustrating an exemplary embodiment of partially voided anti-pad 220 having non-voided areas 200 and voided areas 210. Conductive plane 20 can be made of copper, a copper alloy, or any suitable conductive material or alloy including a conductive material. In one embodiment, partially voided anti-pad 220 is formed by partially removing the conductive material from conductive plane 20 around via 10. In another embodiment, partially voided anti-pad 220 is formed by first completely removing the conductive material from conductive plane 20 around via 10, and then placing conductive material around via 10 to create non-voided areas 200. In one embodiment, the conductive material of non-voided areas 200 is electrically connected to the conductive material of conductive plane 20. In another embodiment, the conductive material of non-voided areas 200 is not electrically connected to the conductive material of conductive plane 20.

In one embodiment, the pattern formed by non-voided areas 200 of anti-pad 220 is a cross hatching pattern. In other embodiments, the pattern formed by non-voided areas 200 of anti-pad 220 is another suitable pattern, such as circular, screen, concentric circles, radial spokes, or an arbitrary pattern. The pattern can be a symmetric or asymmetric pattern. Partially voided anti-pad 220 provides a support structure to maintain the planarity of the PCB by preventing dielectric material from settling into anti-pad voids 210. With patterned partially voided anti-pad 220, dips 120, shown in FIG. 3, can be reduced, minimized, or eliminated.

The stray capacitance associated with an anti-pad is inversely proportional to the surface area of removed conductive material within an anti-pad. As the amount of conductive material removed from conductive plane 20 near via 10 increases, stray capacitance 40 decreases. A partially voided anti-pad enables more conductive material to be removed from the conductive plane than the fully voided anti-pad of FIG. 2. More conductive material can be removed from a partially voided anti-pad by increasing the size of the anti-pad and leaving behind a pattern of conductive material to support the PCB. In this fashion, stray capacitance 40 is reduced while board planarity is maintained. The size of the anti-pad can therefore be increased without the previous disadvantage of decreasing board planarity.

Figure 5:
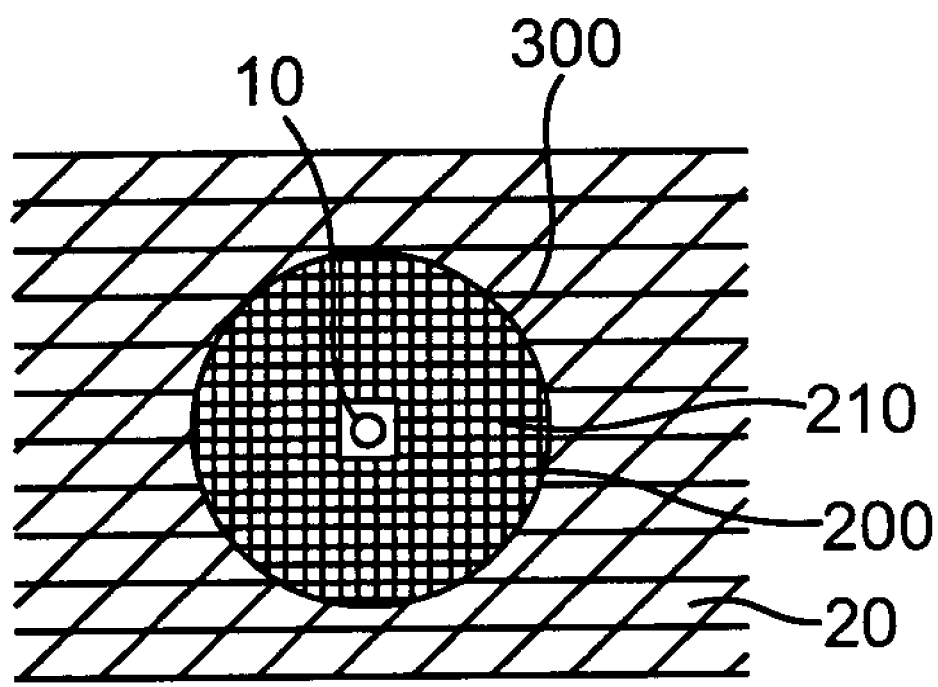
FIG. 5 is a diagram illustrating another exemplary embodiment of a cross section of a via and an associated partially voided anti-pad.

FIG. 5 is a diagram illustrating another exemplary embodiment including anti-pad 300 on conductive plane 20 around via 10. In this embodiment, the pattern for partially voided anti-pad 300 is a screen pattern.

The partially voided anti-pad 300 has non-voided areas 200 and voided areas 210. A screen pattern results in significant removal of the conductive material from a conductive plane 20, indicated at 210, to reduce stray capacitance 40, while providing adequate support from material 200 to reduce settlement of dielectric material to maintain board planarity.

A desired pattern of conductive material for particular PCB anti-pads can be determined by balancing various factors including but not limited to: costs, manufacturing technologies, stray capacitance tolerances, and PCB non-planarity tolerances. There are a series of design tradeoffs to be made between these factors. For example, if the stray capacitance is reduced by removing more conductive material from an anti-pad, thereby leaving less conductive material for support, board planarity is more likely to become an issue. Based upon the tradeoffs between these items, the pattern for a particular anti-pad can include any suitable pattern or combination of patterns, such as concentric circles, either connected or not connected, radial spokes, stars, cross hatches, screens, or an arbitrary or random pattern.

By reducing stray capacitance, partially voided anti-pads enable signal integrity to be maintained for high speed signals, such as signals from approximately 2 GHz and higher, which are transmitted through vias. In addition, partially voided anti-pads enable board planarity to be maintained due to the support structure from the pattern of conductive material that prevents dielectric material from settling into the anti-pad voids. Thus, integrated circuits that generate high speed signals can be mounted on the PCB without reducing the signal integrity due to either stray capacitance or board non-planarity.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A printed circuit board comprising:
a conductive layer;
a via transecting the conductive layer; and
an anti-pad around the via, the anti-pad comprising a pattern of conductive material having a plurality of voids,
wherein the pattern of conductive material is electrically isolated.

2. The printed circuit board of claim 1, wherein the pattern of conductive material is configured to maintain planarity of the printed circuit board.

3. The printed circuit board of claim 1, wherein the pattern of conductive material is configured to prevent settling of dielectric material in the printed circuit board near the via.

4. The printed circuit board of claim 1, wherein the via is configured for data transfer rates greater than approximately 2 GHz.

5. The printed circuit board of claim 1, wherein the pattern of conductive material is configured for data transfer rates through the via greater than approximately 2 GHz.

6. The printed circuit board of claim 1, wherein the pattern of conductive material is substantially circular in shape.

7. The printed circuit board of claim 1, wherein the conductive layer comprises a power plane.

8. The printed circuit board of claim 1, wherein the conductive layer comprises a ground plane.

9. The printed circuit board of claim 1, wherein the pattern comprises a symmetric pattern.

10. The printed circuit board of claim 1, wherein the pattern comprises an asymmetric pattern.

11. The printed circuit board of claim 1, wherein the pattern comprises a concentric circles pattern.

12. The printed circuit board of claim 1, wherein the pattern comprises a radial spokes pattern.

13. The printed circuit board of claim 1, wherein the pattern comprises an arbitrary pattern.

14. The printed circuit board of claim 1, wherein the pattern comprises a screen pattern.

15. A printed circuit board comprising:
a conductive plane;
a via signal barrel transecting the conductive plane; and
an anti-pad between the conductive plane and the via signal barrel, the anti-pad having a pattern of conductive material, wherein a signal can not be transmitted between the conductive plane and the via signal barrel, and
wherein the pattern of conductive material is electrically isolated.

16. The printed circuit board of claim 15, wherein the pattern of conductive material includes a plurality of voids.

17. The printed circuit board of claim 15, wherein the anti-pad is configured to maintain planarity of the printed circuit board.

18. The printed circuit board of claim 15, wherein the anti-pad is configured to minimize stray capacitance between the via and the conductive plane.

19. The printed circuit board of claim 15, wherein the anti-pad is configured to prevent settling of dielectric material in the printed circuit board adjacent the via signal barrel.

20. The printed circuit board of claim 15, wherein the conductive plane comprises one of a power plane and a ground plane.

21. The printed circuit board of claim 15, wherein the conductive plane comprises copper.

22. A method for forming a printed circuit board, comprising:
forming a conductive plane;
forming a via signal barrel transecting the conductive plane; and
forming a partially voided anti-pad between the conductive plane and the via signal barrel,
wherein the partially voided anti-pad is electrically isolated.

23. The method of claim 22, wherein the conductive plane comprises one of a power plane and a ground plane.

24. The method of claim 22, wherein the partially voided anti-pad is formed to maintain the planarity of the printed circuit board.

25. The method of claim 22, wherein the partially voided anti-pad is formed to minimize stray capacitance between the via and the conductive plane.

26. The method of claim 22, wherein the partially voided anti-pad is formed by removing conductive material from the conductive plane in a pattern.

27. The method of claim 26, wherein removing conductive material is performed by using an etching process.

28. The method of claim 26, wherein the pattern comprises one of a symmetric pattern and an asymmetric pattern.

29. The method of claim 26, wherein the pattern comprises a screen pattern.

30. The method of claim 26, wherein the pattern comprises one of an arbitrary pattern and a random pattern.

31. The method of claim 22, wherein the anti-pad is substantially circular in shape.

32. The method of claim 22, wherein the via signal barrel is substantially circular in shape.

33. A printed circuit board comprising:
a conductive layer;
a via transecting the conductive layer; and
an anti-pad around the via, the anti-pad comprising a pattern of conductive material having a plurality of voids, the pattern of conductive material isolated from the conductive layer,
wherein the pattern comprises an asymmetric pattern.

34. A printed circuit board comprising:
a conductive layer;
a via transecting the conductive layer; and an anti-pad around the via, the anti-pad comprising a pattern of conductive material having a plurality of voids, the pattern of conductive material isolated from the conductive layer, wherein the pattern comprises a concentric circles pattern.

35. A printed circuit board comprising:

a conductive layer;

a via transecting the conductive layer; and an anti-pad around the via, the anti-pad comprising a pattern of conductive material having a plurality of voids, wherein the pattern comprises a screen pattern.

* * * * *